US011817275B2

(12) United States Patent
Wang et al.

(10) Patent No.: US 11,817,275 B2
(45) Date of Patent: Nov. 14, 2023

(54) MEMBRANE SEALED KEYBOARD

(71) Applicant: Apple Inc., Cupertino, CA (US)

(72) Inventors: Paul X. Wang, Cupertino, CA (US); Abidur R. Chowdhury, San Francisco, CA (US); Bart K. Andre, Palo Alto, CA (US); Dinesh C. Mathew, San Francisco, CA (US); Keith J. Hendren, San Francisco, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/447,251

(22) Filed: Sep. 9, 2021

(65) Prior Publication Data

US 2021/0407748 A1 Dec. 30, 2021

Related U.S. Application Data

(63) Continuation of application No. 16/584,560, filed on Sep. 26, 2019, now Pat. No. 11,139,129.

(51) Int. Cl.
*H05K 5/00* (2006.01)
*H01H 13/86* (2006.01)

(52) U.S. Cl.
CPC ....... *H01H 13/86* (2013.01); *H01H 2223/003* (2013.01)

(58) Field of Classification Search
None
See application file for complete search history.

(56) References Cited

U.S. PATENT DOCUMENTS

| | | | | | |
|---|---|---|---|---|---|
| 4,560,845 | A | 12/1985 | Takamura et al. | | |
| 6,743,993 | B1 * | 6/2004 | Clark | H01H 13/702 | 200/314 |
| 7,608,792 | B1 * | 10/2009 | Tsai | H01H 13/83 | 200/310 |
| 7,847,204 | B2 * | 12/2010 | Tsai | H01H 13/83 | 200/313 |
| 8,035,051 | B2 | 10/2011 | Yanagida | | |
| 10,119,683 | B2 * | 11/2018 | Hirakata | H04W 72/23 | |
| 10,777,371 | B1 * | 9/2020 | Tsai | H01H 13/10 | |
| 11,139,129 | B2 * | 10/2021 | Wang | H01H 13/86 | |
| 2007/0199804 | A1 * | 8/2007 | Joseph | H01H 13/705 | 200/5 A |
| 2008/0081679 | A1 * | 4/2008 | Kawasaki | H04M 1/18 | 455/575.8 |

(Continued)

*Primary Examiner* — Anthony Q Edwards
*Assistant Examiner* — Rashen E Morrison
(74) *Attorney, Agent, or Firm* — DORSEY & WHITNEY LLP

(57) ABSTRACT

Keyboards and other input devices are provided with at least one flexible layer that extends over or under the keycaps. The flexible layer spans interkey spaces and lies between inner and outer keycaps. The flexible layer prevents intrusion of invasive material to the keyboard mechanisms and simplifies the appearance of the keyboard area. Some flexible layers help align keycaps by connecting inner and outer keycaps or by providing a mechanical connection interface for the keycaps. Some membranes used in the flexible layer have a layered or composite construction that increases durability and tear resistance by attaching or infusing a mesh material or other tough material to a less durable, elastic material.

19 Claims, 6 Drawing Sheets

(56) References Cited

U.S. PATENT DOCUMENTS

| | | | | |
|---|---|---|---|---|
| 2009/0133999 | A1* | 5/2009 | Yamada | H01H 3/125 200/345 |
| 2011/0290628 | A1* | 12/2011 | Tsai | H01H 13/83 200/5 A |
| 2011/0297523 | A1* | 12/2011 | Tsai | H01H 3/125 200/5 A |
| 2012/0092263 | A1* | 4/2012 | Peterson | G06F 3/0443 345/168 |
| 2013/0313094 | A1* | 11/2013 | Shen | H01H 13/86 200/5 A |
| 2014/0069792 | A1* | 3/2014 | Bates | G06F 1/1628 156/242 |
| 2016/0351360 | A1* | 12/2016 | Knopf | H01H 13/705 |
| 2017/0060190 | A1* | 3/2017 | Hegde | G06F 1/1656 |
| 2019/0091946 | A1 | 3/2019 | Lancaster-Larocque et al. | |

* cited by examiner

MEMBRANE SEALED KEYBOARD

CROSS-REFERENCE TO RELATED APPLICATION(S)

This is a continuation of U.S. patent application Ser. No. 16/584,560 filed 26 Sep. 2019, and entitled "MEMBRANE SEALED KEYBOARD," the disclosure of which is hereby incorporated by reference in its entirety.

FIELD

The described embodiments relate generally to keyboards and input devices for computers and other electric devices. More particularly, the present embodiments relate to flexible structures used in keyboards.

BACKGROUND

Electronic devices use a variety of different input devices. Examples of such input devices include keyboards, computer mice, touch screens, buttons, trackpads, and so on. They may be incorporated into an electronic device or can be used as peripheral devices. The electronic device may be vulnerable to contaminants, such as dust or liquid, entering though openings or connections in or around one or more incorporated or external input devices.

Keyboards typically have a number of moving keys. Liquid ingress around the keys and into the keyboard can damage internal electronics. Residues from such liquids, such as sugar, may corrode or block electrical contacts, prevent key movement by bonding moving parts, and so on. Solid contaminants (such as dust, dirt, food crumbs, and the like) may lodge under keys, block electrical contacts, and obstruct key movement. These devices can also be undesirably expensive to make and assemble.

The keys on a conventional keyboard are spaced apart to provide key definition. Key definition is a property of a keyboard that describes how easily a user can tell where a key is located by sight or touch. Typically, strong key definition correlates with large gaps or grooves between the keycaps since those gaps or grooves help orient the user's fingers on the keyboard. However, spacing apart the keys produces gaps through which liquid and particles can pass into the keyboard. Additionally, due to manufacturing tolerances, keycaps can be slightly misaligned when they each are supported by separate switches, domes and related key mechanisms, thereby leading to an imprecise and noisy visual appearance.

Thus, there are many challenges and areas for improvements in input devices such as keyboards.

SUMMARY

Aspects of the present disclosure relate to keyboards. In one example, the keyboard can include an electronics unit including a set of key structures, a housing containing the electronics unit can include and upper surface and a downward-facing wall. A flexible membrane extends over the electronics unit and over the upper surface, with the flexible membrane being attached to the downward-facing wall of the housing. The set of key structures can be actuatable upon displacement of the flexible membrane relative to the housing.

In some embodiments, the housing can comprise a bottom surface, and the downward-facing wall of the housing can be positioned above the bottom surface. The housing can comprise a sidewall recess, and the downward-facing wall can be positioned within the sidewall recess. The housing can comprise a sidewall, and the flexible membrane can contact the sidewall. In some embodiments, the keyboard can comprise a rigid frame attached to an inside surface of the flexible membrane, wherein the rigid frame is attached to the housing or attached to the rigid web.

In some embodiments, the flexible membrane comprises an elastic material. A set of rigid keycaps can be positioned on a top surface of the flexible membrane. A touch pad can also be included, wherein the flexible membrane can comprise a touch pad opening and the touch pad can be accessible through the touch pad opening. An entire top surface of the keyboard input device can be waterproof.

The housing can comprise an internal cavity and a sidewall or bottom wall, wherein the sidewall or bottom wall can have a vent passage connecting the internal cavity to an external atmosphere surrounding the housing, with the vent passage being configured to redirect external water away from the electronics unit.

Another aspect of the disclosure relates to a keyboard input device comprising a housing, a set of key structures positioned in the housing, and a composite membrane extending over the set of key structures, with the composite membrane comprising a mesh material combined with an elastomeric material and with the mesh material having a greater toughness relative to the elastomeric material. The mesh material can comprise knit or woven fibers. The elastomeric material can cover a top surface of the mesh material. The elastomeric material can encapsulate the mesh material.

Yet another aspect of the disclosure relates to a keyboard input device comprising a base, an electronics substrate positioned in the base, a membrane positioned over the electronics substrate and the base, a set of inner keycaps positioned between the electronics substrate and the membrane, a set of outer keycaps positioned on a top surface of the membrane, and a set of aligning features in the membrane, with the set of aligning features aligning the set of inner keycaps with the set of outer keycaps.

The set of aligning features can comprise a material joining an inner keycap of the set of inner keycaps to an outer keycap of the set of outer keycaps through an opening in the membrane. The set of aligning features can comprise a recess in the membrane, with the recess receiving an upward-extending protrusion of an inner keycap or a downward-extending protrusion of an outer keycap. In some embodiments, the membrane can comprise a reinforcement between two adjacent inner keycaps of the set of inner keycaps. A portion of the membrane can extend between the reinforcement and at least one of the two adjacent inner keycaps. The reinforcement can exhibit a width that is less than a distance between the adjacent inner (and/or outer) keycaps.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
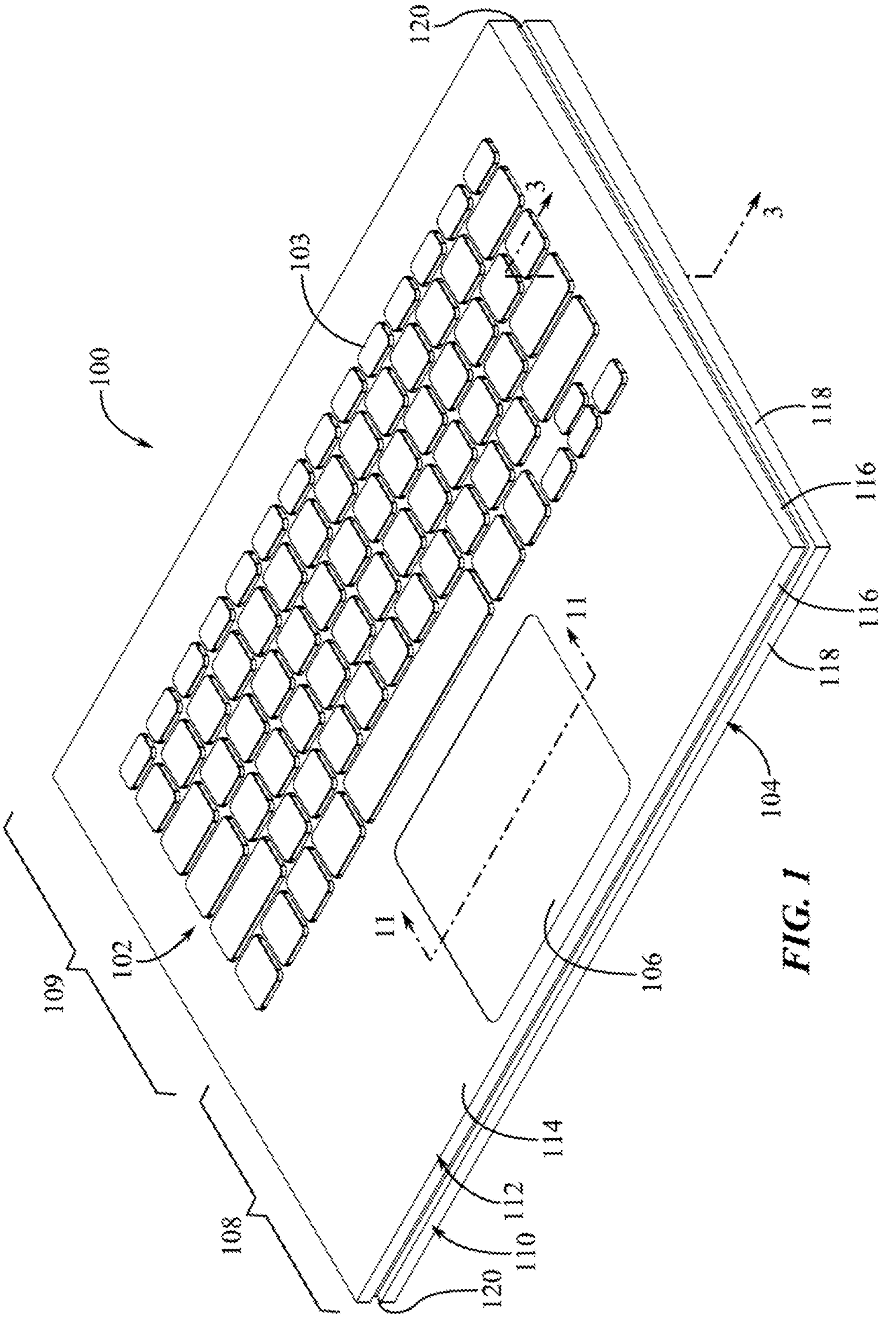
FIG. 1 shows an isometric view of an electronic device.

Reference will now be made in detail to representative embodiments illustrated in the accompanying drawings. It should be understood that the following descriptions are not intended to limit the embodiments to one preferred embodiment. To the contrary, the description is intended to cover alternatives, modifications, and equivalents as can be included within the spirit and scope of the described embodiments as defined by the appended claims. The description includes sample systems and apparatuses that embody various elements of the present disclosure. However, it should be understood that the described disclosure can be practiced in a variety of forms in addition to those described herein.

The present disclosure relates to keyboards and/or other input devices that include keycaps and at least one flexible structure attached to the keycaps. The flexible structure, such as, for example, a flexible membrane, fabric, mesh, woven material, knitted material, or composite layer, can provide flexible bridges or interkey supports between the keycaps that, in combination with the keycaps, make a substantially continuous, smoothed, consistent-visual-appearance, sound-muting, and ingress-resistant top surface and interkey covering for the input device.

Debris, fluids, and other contaminants can penetrate between the keys of conventional keyboards, leading to numerous issues with the appearance, feel, and function of the keys. Therefore, another aspect of the present disclosure relates to using the flexible structure and keycaps to limit ingress of unwanted material into the keyboard by providing a substantially continuous upper surface layer for the keyboard. The flexible structure can have a spill-proof, waterproof, fluid-tight, and/or unbroken top surface so that any contaminants are held by the flexible structure spaced away from the inside of the keyboard. Contaminants on the flexible structure can then be easily and safely removed from the keyboard without ever penetrating into contact with the more sensitive interior components.

A membrane can be positioned between outer keycaps and inner portions of the keyboard such as inner keycaps, collapsible domes, stabilizers (e.g., a butterfly or scissor hinge mechanism), and base components (e.g., a substrate, base layer, housing, etc.). Fluid and debris that falls between the keycaps can be blocked and held by the membrane at a location where it can be more easily cleaned off or otherwise removed from the keyboard. The fluid and debris can also thereby be prevented from coming into contact with electrically charged portions of the keyboard or interfering with the function of domes, stabilizers, and other moving parts of the keyboard.

The flexible structure that limits contaminant ingress can fill interkey spaces with flexible and compliant material, provide a relatively smooth top surface, reduce the thickness of and the number of parts in the key assembly, and distribute light through the keyboard. Flexible structures can include ridges, grooves, waves, recesses, protrusions, and raised portions that collect debris and fluids, provide key definition, and enable the flexible structure to stretch or extend laterally when keys are pressed. In some embodiments, the flexible structures or slack portions of a membrane can be hidden underneath a keycap or other rigid user interface surface, whereby flexing or folding/unfolding movement of the membrane can be obscured from the view of the user.

Another aspect of the disclosure relates to features for attaching the flexible membrane to a keyboard housing without a visible seam or break between the membrane and the housing when viewed from above. The flexible membrane can be attached to the housing in a position recessed away from a user in order to protect the connection between the membrane and the housing and reducing the possibility of the membrane being peeled or scratched away from the housing. In some embodiments, the edge or end of the membrane can be attached to a downward-facing surface of the housing or can be positioned with a recess sized and configured to limit user access to the edge or end of the membrane. Air vent openings can also be positioned in the recess.

In some embodiments, the flexible membrane comprises features to resist puncturing or tearing the flexible material. For example, in some embodiments, the flexible membrane can comprise a composite material including a mesh (e.g., a woven or knitted material) that is encased or encapsulated by a flexible rubber or other elastomeric material (e.g., silicone). The mesh can comprise a loose weave or knit that enables the elastomeric material to stretch and deflect while the mesh provides providing limits to the stretch or deflection and provides improved toughness and cut resistance that reduces propagation and enlargement of pierces and tears in the elastomeric material.

In additional embodiments, the flexible membrane can comprise openings or other alignment features that allow outer and inner keycaps to be attached or connected to each other with central alignment along a vertical axis of motion. In some configurations, the membrane can comprise at least one opening for each pair of outer and inner keycaps, and a protrusion or adhesive plug can join the outer and inner keycaps through the opening in order to ensure their horizontal and rotational alignment relative to the membrane. Alternatively, the membrane can comprise a keying shape such as a boss forming an opposing set of one or more protrusions and grooves that are mechanically supported by and attached to respective outer and inner keycaps, thereby providing a mechanical interface for alignment of keys on each side of the membrane.

Keyboards of the present disclosure can also include features to support or seal an integrated trackpad, venting air or draining fluid from within the housing while preserving water resistance of the device under normal use conditions, and supporting the shape of the membrane between keycaps.

These and other embodiments are discussed below with reference to the figures. Those skilled in the art will readily appreciate that the detailed description given herein with respect to these figures is for explanatory purposes only and should not be construed as limiting.

FIG. 1 depicts an electronic device 100 including a keyboard 102. The keyboard 102 includes keys or key assemblies with keycaps 103 or button caps that move when depressed by a user. The electronic device 100 can include one or more devices or mechanisms that prevent or alleviate contaminant ingress into or through the keyboard 102, such as ingress between the keycaps 103 and into a housing 104 of the electronic device 100. Such devices or mechanisms can include, for example, an interkey bridge structure, layer structure, or flexible membrane extending across or underneath the keycaps 103, as described in connection with various embodiments of the present disclosure. Such contaminants can include liquids (e.g., water, soft drinks, sweat, and the like), solids (e.g., dust, dirt, skin particles, food particles, and the like), and any other small debris or foreign material.

The electronic device 100 can also include a track pad 106 (or other pointing device) and internal electronic components used in an input device or a notebook/laptop computer (e.g., a processor, controller, electronic memory device, electronic data storage device, and other computer components). The track pad 106 can be positioned in a front portion (e.g., the palm rest portion 108) of the electronic device 100 and can therefore be configured to be positioned between the keyboard 102 and the user. In some embodiments, the track pad 106 can be positioned to a lateral (e.g., left or right) side of the keyboard 102. In further embodiments, the keycaps 103 can receive touch pad-like capacitive input from a user instrument contacting the keycaps 103 or moving across the keycaps 103. A track pad 106 can also be omitted.

The housing 104 can comprise a lower portion 110 and an upper portion 112. The upper portion 112 can have a top surface 114 and side surfaces 116. The lower portion 110 can also have side surfaces 118 and a bottom surface 119. See also FIG. 3. The side surfaces 116, 118 can be vertically aligned and coplanar. In some embodiments, upper portion side surfaces 116 are spaced apart at a greater lateral width than the lower portion side surfaces 118. Accordingly, side surfaces 116 can overhang side surfaces 118 or a perimeter of the upper portion 112 or top surface 114 can be greater than and enclose a perimeter of the lower portion side surfaces 118 when viewed from a direction perpendicular to the top surface 114. The lower portion 110 and upper portion 112 can be separated by a gap or recess 120 (e.g., a channel extending around the perimeter of the housing 104). See also FIG. 3.

Although the electronic device 100 of FIG. 1 is a peripheral computer keyboard input device, it will be readily apparent that features and aspects of the present disclosure that are described in connection with the electronic device 100 can be applied in various other devices. These other devices can include, but are not limited to, personal computers (including, for example, notebook or laptop computers, computer towers, "all-in-one" computers, computer workstations, and related devices) and related accessories, media player devices and related accessories, remotes, computer mice, trackballs, and touchpads, point-of-sale equipment, cases, mounts, and stands for electronic devices, controllers for games, home automation equipment, and any other electronic device that uses, sends, or receives human input. Thus, the present disclosure provides illustrative and non-limiting examples of the kinds of devices that can implement and apply aspects of the present disclosure.

Figure 2:
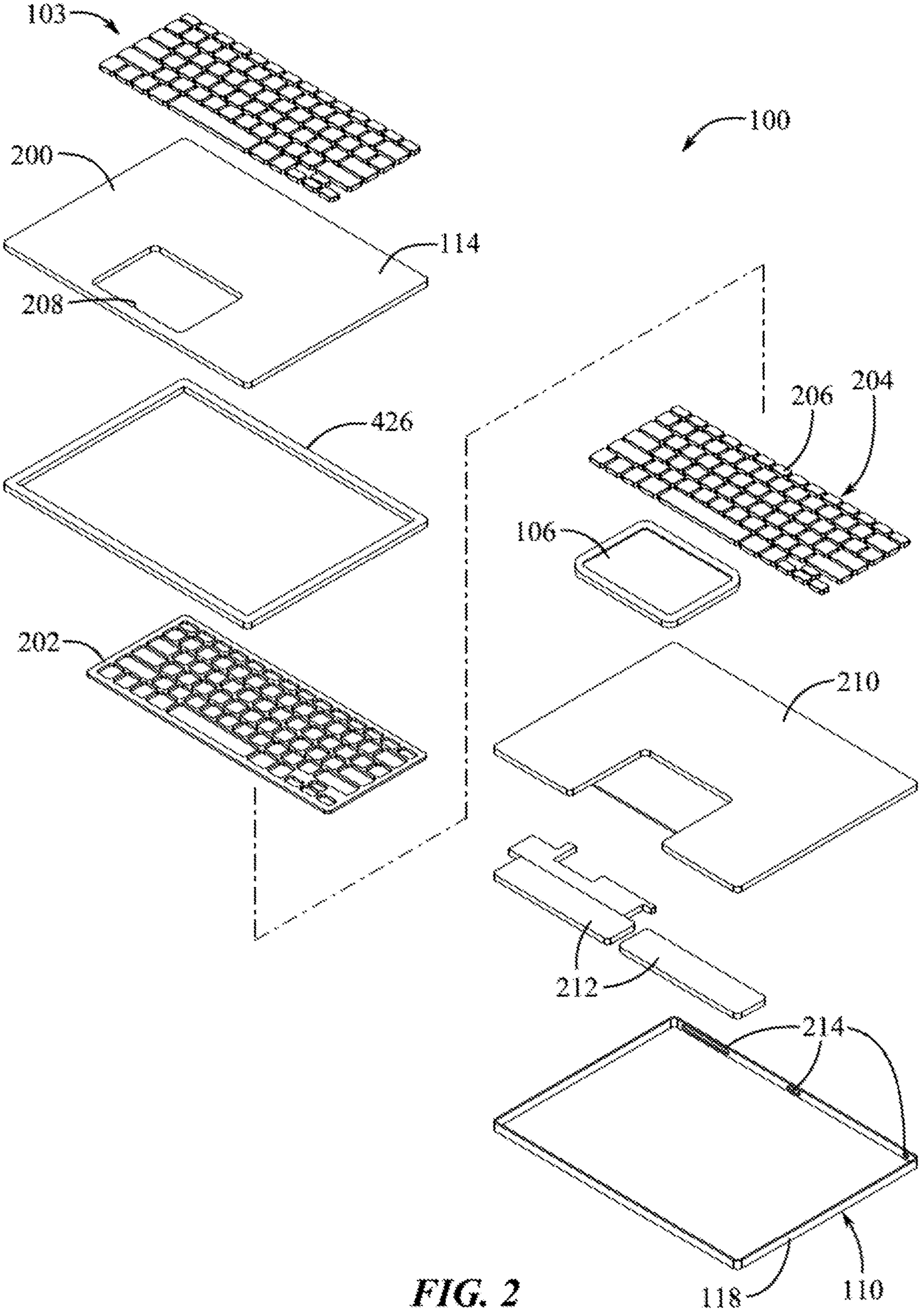
FIG. 2 shows an exploded view of the electronic device of FIG. 1.
Figure 3:
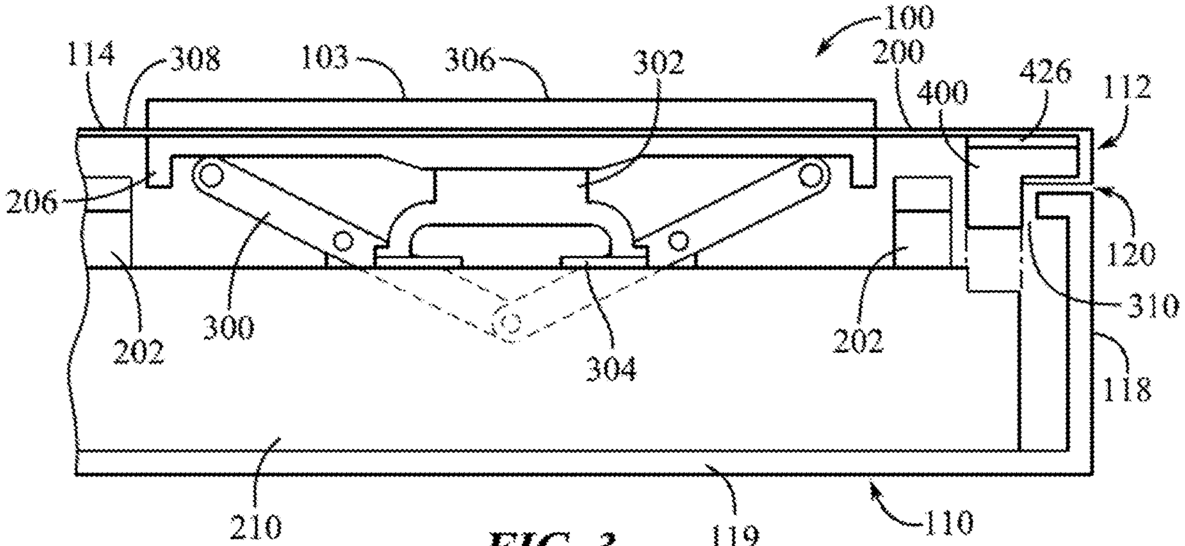
FIG. 3 shows a side section view of a key mechanism and housing of the electronic device of FIG. 1 as indicated by section lines 3-3 in FIG. 1.

The keyboard 102 can include a set of assembled components that correspond to each key. The assembly of these components can be referred to as a "stack-up" due to their substantially layered or stacked configuration. FIG. 2 illustrates a partially exploded view of the electronic device 100 showing internal components of the keyboard 102. FIG. 3 shows a partial side section view of the electronic device 100 as taken through section lines 3-3 in FIG. 1.

As shown in FIGS. 2-3, the keyboard 102 can have a set of outer keycaps 103 with at least one being used in connection with each key or button of the keyboard. An interkey bridge structure, layer structure, flexible layer, or flexible membrane 200 can be positioned below and attached to the undersides of the outer keycaps 103. A rigid web 202 can be positioned under the flexible membrane 200 can comprise an array of openings configured to be underneath each of the outer keycaps 103. An inner keyboard module 204 can have a set of key stabilizer mechanisms 300 (e.g., scissor or butterfly stabilizers that reduce the tendency of a keycap to tip or rotate when a corner or side of the keycap is pressed), inner keycaps 206, a set of switch structures 302 (e.g., collapsible metal or rubber domes), and a printed circuit board (PCB), electronics substrate, conductive membrane, or similar feature plate 304. The inner keyboard module 204 can be referred to an electronics unit or as part of an electronics unit.

Rigid web 202 can comprise a rigid material such as metal (e.g., aluminum, brass, or steel), rigid polymer (e.g., polycarbonate), or composite (e.g., carbon fiber composite). The rigid web 202 can provide stiffness to the PCB or feature plate 304 of the inner keyboard module 204. In some embodiments, stabilizers can be attached to the rigid web 202 to improve the translational stability of larger keycaps. The rigid web 202 can be a single piece and can have openings that are produced by stamping, drilling, milling, forging, or other similar manufacturing processes.

The inner keyboard module 204 and track pad 106 can be attached to a base support 210 and electronics 212 within the lower portion 110 of the housing 104. The track pad 106 can be positioned in an opening 208 in the flexible membrane 200. The base support 210 can support the inner keyboard module 204 and track pad 106 and can orient them in the internal space of the electronic device 100 relative to the lower portion 110 so that they are vertically inclined (e.g., at about a 3- to 7-degree raised angle relative to a horizontal plane). The base support 210 can comprise a rigid plastic or metal material. In some embodiments, the base support 210 can be integrated with the lower portion 110 as a single piece.

Electronics 212 can comprise electronics for operating the inner keyboard module 204. The electronics 212 can include an antenna, a battery, a processor, a transceiver, an electrical connector, power or settings switches, and related components used to operate the keyboard 102 and track pad 106 while connected (via a wire or wirelessly) with a main computing device. Portions of the electronics 212 (e.g., power switches or other user inputs) can be accessible through apertures 214 in the lower portion 110 of the housing 104. In some embodiments, the apertures 214 are sealed around the electronics 212 so that particles and fluids cannot penetrate through the apertures 214 and into the lower portion 110 or base support 210. The electronics 212 can be referred to as an electronics unit or as part of an electronics unit (e.g., in combination with the inner keyboard module 204).

The outer keycaps 103 can provide surfaces against which a user can interface with the keyboard 102. Thus, the outer keycaps 103 can be movable between an unactuated or neutral state at a first vertical position relative to the feature plate 304 or base support 210 and an actuated or depressed state at a second vertical position relative to the feature plate 304 or base support 210. The outer keycaps 103 and inner keycaps 206 can comprise a rigid material such as a hard plastic, metal, ceramic, composite, related material, or combinations thereof. In an example embodiment, the outer keycaps 103 and inner keycaps 206 include a glass, a rigid polymer, or a rigid fabric material.

The outer keycaps 103 can include a glyph or symbol on their top surfaces 306. See FIGS. 3, 5, and 6. In some cases, the outer and inner keycaps 103, 206 can be at least partially transparent or translucent, thus allowing light to be transferred or diffused through them. See also FIG. 12 and its related descriptions herein. The light can be directed through or around glyphs or symbols of the outer keycaps 103 in order to improve their contrast and readability for the user. In various cases, the outer keycaps 103 can have a top surface 306 that is substantially planar and flat (e.g., with or without edges that are chamfered, beveled, or rounded), substantially spherically dished, or substantially cylindrically "scooped." The outer keycaps 103 can be arranged in a keyboard layout, such as, for example, an ANSI layout, ISO layout, JIS layout, Colemak, Dvorak, numpad/tenkey layout, AZERTY layout, a custom layout, or a related layout.

The flexible membrane 200 (i.e., flexible layer) can be coupled with at least the outer keycaps 103 and can be entirely flexible or can have flexible portions positioned between the outer keycaps 103. The flexible layer 200 can therefore be attached to the keycaps 103, 206, such as being adhered, co-molded, or overmolded to the keycaps 103, 206. The flexible layer 200 can comprise a flexible material such as, for example, an elastically deformable material or a bendable material. Thus, the keycaps 103, 206 and flexible layer 200 can form a single layer or sheet extending across the keyboard 102 in the manner shown in FIGS. 1-3. The flexible layer 200 can displace as a keycap 103 to which it is connected moves in a vertical direction. For example, the portion of the flexible layer 200 under the keycap 103 can be displaced vertically downward, and a portion of the flexible layer 200 around the keycap 103 can be stretched or tilted into a concave shape as the keycap 103 moves downward. When an outer keycap 103 is moved from its neutral (i.e., raised) position to a depressed (i.e., lowered) position, the flexible layer 200 can move with the keycap and deform at least locally around at least portions of the perimeter of the keycap.

The material used in the flexible layer 200 can comprise a rubber, silicone, polymer (e.g., a thermoplastic polymer such as thermoplastic polyurethane (TPU), polyethylene terephthalate (PET), or HYTREL® by DUPONT™), fabric (e.g., a flexible sheet of entwined mesh material, woven material, textile, knit material, similar materials, and combinations thereof), flexible or bendable composite, related materials, and combinations thereof. See also FIGS. 5-6 and their related descriptions herein. The flexible layer 200 can have a continuous and fluid-tight top or bottom surface to help prevent debris, fluids, and other materials from penetrating through the flexible layer 200. For example, a fabric or woven material used in the flexible layer 200 can have a sealing material (e.g., polyurethane, vinyl, silicone, or another fluid-resistant material) applied to the top or bottom surface of the fabric or woven material to improve fluid resistance and to fill openings or gaps between filaments used in the fabric or woven material. A mesh material having a sealing elastomeric material added to it is referred to herein as a "sealed mesh material."

The flexible layer 200 can also prevent penetration of a user instrument (e.g., a fingertip, fingernail, or stylus) through the interkey gaps (e.g., 308 in FIG. 3) that are between the outer keycaps 103. See also FIGS. 4B, 4C, and 5-8. The flexible layer 200 can be configured to be sufficiently rigid (or can be under sufficient pretension) so that it does not significantly sag between the outer keycaps 103. Thus, the flexible membrane 200 can have a planar top surface across the entire housing 104.

The inner keycaps 206 can be positioned internal to the flexible layer 200 relative to the outer keycaps 103. The inner keycaps 206 can comprise connectors configured to engage the switch structures 302 and key stabilizer mechanisms 300. In some embodiments, the outer keycaps 103 comprise connectors that extend through the flexible layer 200. See FIG. 11.

The flexible layer 200 and/or keycaps 103, 206 can be used to provide a touch-sensitive interface with an electronic device. The flexible layer 200 and/or keycaps 103, 206 can therefore include electrodes or other electrical leads or traces that are configured to detect a touch. For example, the electrical components of the flexible layer 200 and/or keycaps 103, 206 can be configured to detect a capacitive load or a pressure against or near the top surfaces of the flexible layer 200 and/or keycaps 103, 206. Touch interface signals can be provided to a controller (e.g., in the electronic device 100) in a manner providing input to the electronic device. Thus, aspects of the electronic device 100 (or a connected computing device) can be controlled based on touch input from the flexible layer 200 and/or keycaps 103, 206. A user instrument such as a finger or stylus can be moved across the top surfaces of the flexible layer 200 and/or keycaps 103, 206 and can be used to control the electronic device in a manner separate from the actuation of switch structures 302 that are actuated by pressing down a keycap 103/206 to mechanically, capacitively, or electrically actuate a switch.

In some embodiments, the flexible layer 200 and/or keycaps 103, 206 are not the structures capable of detecting touch input, and an additional layer (not shown) is provided above or below the flexible layer 200 that is configured to detect touches on its surface or through the flexible layer 200 and/or keycaps 103, 206.

The switch structures 302 can comprise key stabilizers, switches, compressible domes, dome housings, deflectable conductors, and other keyboard structures. These switch structures 302 can stabilize the vertical movement of the keycaps 103, 206, provide an upward biasing force against the keycaps 103, 206, provide tactile feedback to the movement of the keycaps 103, 206, and provide switch structures (e.g., conductors) that can be actuated to provide electrical signals to a keyboard controller (not shown), among other functions known in the art. The keyboard controller can comprise a microcontroller, processor, or other computing device configured to receive electrical signals from the switch structures 302 and process the input signals or forward the input signals as keycodes to another processor. The keyboard controller can be connected to the switch structures and/or another controller using an electrical bus interface.

A key stabilizer 300 can comprise a mechanical hinge or related mechanism configured to stabilize the movement of the keycaps 103, 206 as they vertically travel through a movement cycle. The stabilization can limit or prevent a keycap from rotating when an off-center-oriented vertical force is applied to the top of the keycap (e.g., a force applied laterally offset from, but parallel to, a center vertical axis of the keycap). In some embodiments, a key stabilizer keeps a keycap substantially parallel to a base layer or another horizontal plane (e.g., feature plate 304) when the keycap is also oriented horizontally in its unactuated or neutral state. Thus, the key stabilizer can include a scissor mechanism, butterfly mechanism, or related device used to stabilize keys in keyboards. The key stabilizers can comprise a rigid material and can be optically translucent or transparent to help distribute light throughout the underside of the keycaps.

Collapsible domes of the switch structures 302 can provide resistance and tactile feedback to the user when the keycaps are pressed. A collapsible dome can also be used to bias a keycap vertically upward when the keycap has been at least partially depressed. Thus, the collapsible dome can comprise a compressible or collapsible material configured to resiliently change shape upon application of a force to the dome. The material can comprise metal, rubber, silicone, another related flexible material, and combinations thereof.

The web structure 202 can be a rigid structure positioned below the keycaps 103, 206 and flexible layer 200. The web structure 202 can be a separate part attached to the inner keyboard module 204 or can be integrally formed with the feature plate 304 (e.g., a molded part of the base layer or a shape formed in a milled base layer). The web structure 202 can increase the structural stiffness of the feature plate 304 or other base layer and can be a structure on which other components are mounted.

The web structure 202 can be configured with a height wherein its top surface is positioned below the vertical position of the bottom of the keycap 103, 206 when the keycap is at its most actuated/deflected position relative to the base layer 308. In this manner, the web structure 202 does not come into contact with the keycap 103, 206 even when the keycap is completely pressed. In such an embodiment, the web structure 202 does not limit the movement of the keycap 103, 206 or cause the keycap 103, 206 to have a hard and limiting "bottom-out" against the web structure 202. The maximum deflection position of the keycap 103, 206 (or at least the maximum depth to which a user instrument can move during normal use of the keyboard 102) can be above the top surface of the web structure 202. When using the keycap 103, 206 normally, the user may not feel the rigid web structure 202, even when the user instrument presses down at least partially over the space between two keycaps 103, 206. Accordingly, this arrangement can help limit the hard, jarring feeling of hitting a rigid, unyielding surface while typing or sliding the user instrument over the top surface of the keyboard. In some embodiments, the web structure 202 is taller and is configured to be positioned alongside a depressed inner keycap 206.

FIG. 3 also shows a vent opening 310 that extends through the housing 104 of the electronic device 100 at the recess 120. The vent opening 310 can comprise a torturous/tumultuous passage through which air can enter or escape the inside of the housing 104 but through which fluids and debris cannot easily or directly pass into the housing 104 without being caught in the passage or without being redirected to a portion of the inside of the housing 104 that is harmless to internal electronic components.

As shown in FIG. 3, for example, the vent opening 310 comprises a horizontal passage portion and a vertical passage portion. Air can therefore easily pass through the vent opening 310, but liquids and debris that enter the recess 120 are either caught in the passage, trapped at the point where the horizontal and vertical passage portions meet, or fall harmlessly into the bottom of the lower portion 110 of the housing 104 where it can collect, drain, or evaporate in a position that is out of contact with electronics due to the base support 210 spacing the inner top surface of the lower portion 110 from the inner keyboard module 204 and electronics 212.

In some embodiments, the electronic device 100 can have a set of multiple vent openings 310, such as, for example, vent openings on multiple lateral sides of the electronic device 100. Thus, if one opening is occluded, the other openings can allow air passage.

In this manner, the electronic device 100 can be watertight except for at the vent openings 310, and it can be water resistant at the vent openings 310 by redirecting liquids to designated safe areas in the housing 104 if it manages to penetrate into the interior through the vent openings 310. Furthermore, in some cases the vent openings 310 can comprise a set of three or more differently-oriented passages through which liquid and debris would have to pass in order to enter the interior cavity of the housing 104, thereby even further complicating the movement of (and reducing the likelihood of) invasive material successfully entering the interior cavity.

Figure 4A:
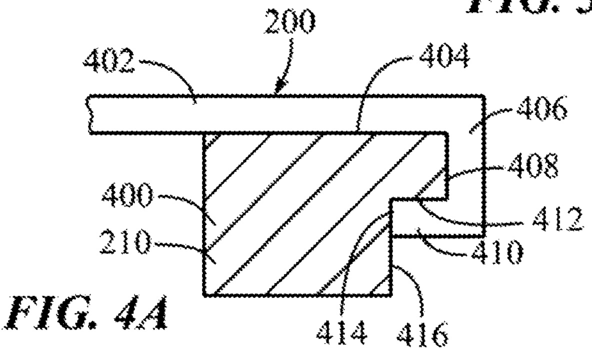
FIGS. 4A-4E illustrate embodiments of membrane-to-support-surface interfaces that can be used in an electronic device.
Figure 4D:
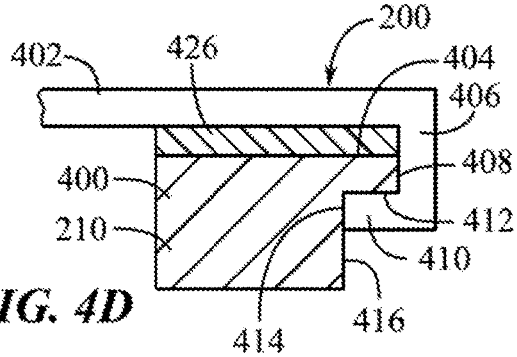

FIGS. 4A-4E show cross-sectional side views of a set of various embodiments of a flexible membrane 200 attached to surfaces of an upper end 400 of a base support 210. In FIG. 4A, the flexible membrane 200 comprises a top portion 402 contacting a top surface 404 of the upper end 400, a side portion 406 contacting a sidewall 408 of the upper end 400, and a bottom portion 410 contacting a downward-facing surface 412 of the upper end 400. The portions 402, 406, 410 of the flexible membrane 200 can each be attached to the respective surfaces 404, 408, 412. For example, the portions 402, 406, 410 can be adhered or co-molded in position with the surfaces of the upper end 400.

Due to the flexible nature of the membrane 200, the end 414 of the membrane 200 (at the inner end of bottom portion 410 in FIG. 4A) can be susceptible to being peeled, scraped, or pried away from the upper end 400. By positioning the end 414 of the membrane 200 in a difficult- or impossible-to-reach area of the electronic device 100, the user can be prevented from dislodging the end 414 of the membrane 200 from the upper end 400. Accordingly, in some embodiments, the end 414 can be positioned as shown in FIG. 4A, wherein the interface between the end 414 of the membrane 200 and the surface of the upper end 400 is positioned inward relative to a sidewall 408, thereby being hidden from the sight of the user when viewed from the top and side of the housing 104. Positioning the end 414 of the membrane 200 within the recess 120 of the housing 104 also limits user access via instruments (e.g., tools or fingers) because there is constricted space around the interface between the end 414 of the membrane 200 and the upper end 400. In other words, the recess 120 only has a narrow lateral opening, and the interface between the end 414 of membrane 200 and upper end 400 is positioned spaced inward relative to the outermost part of that opening.

The housing 104 side surface 118 also blocks entry of an instrument into the recess 120 except for very small instruments (e.g., a few millimeters in diameter at most) that are inserted into the recess 120 at very small angles relative to the horizontal plane (e.g., a few degrees of tilt at most). Thus, a user finger would not be able to reach the end 414 or fit within the recess 120, and any tool insertable into the recess 120 would not be likely to apply significant leverage at the end 414 to peel or scrape it away from the upper end 400. Furthermore, the end 414 of the membrane 200 can be mounted flush against an inner sidewall 416, wherein there is no gap between the inner sidewall 416 and the end 414 where a tool could hook onto or pull the membrane 200 away from the inner sidewall 416 or downward-facing surface 412. Using the membrane 200 as shown in FIG. 4A can also provide all of the benefits of a membrane 200 that has only a top portion 402 or that only has top and side portions 402, 406, as indicated below.

In some embodiments, the end of the flexible membrane 200 can only comprise the top portion 402, and the side and bottom portions 406, 410 can be omitted. For example, the end 414 of the membrane 200 can be coplanar with the sidewall 408 of the upper end 400. Positioning the membrane across the top surface 404 can provide a uniform appearance across the user-facing top surface 114 of the membrane 200, wherein the top surface 114 is entirely planar and a single, consistent texture and color laterally across the keyboard 102 and upper end 400. Additionally, the planar top surface 114 can limit pooling of liquid or accumulation of particles due to the lack of depressions or receptacles. Invasive material can flow off of the top surface 114 without passing over a recess, crease, groove, or other area in which the material would otherwise collect.

In another example embodiment, the end of the flexible membrane 200 can comprise top and side portions 402, 406, and the bottom portion 410 can be omitted. The end 414 of the membrane 200 can therefore be coplanar with the downward-facing surface 412 of the upper end 400. This configuration can beneficially provide a path for invasive material to flow or roll off of the top surface 114 onto the side portion 406, and then fall downward from the side portion 406 without potentially being stuck or drawn into (e.g., by surface tension) a gap or crease between the top portion 402 and the sidewall 408 of the upper end 400. The side portion 406 also protects against a laterally-directed force from a user instrument or from the electronic device 100 falling on its side.

The flexible membrane 200 can comprise a variety of materials, such as, for example, silicone, thermoplastic polyethylene (TPE), a mesh material, a fabric material, a woven or knit material, related materials, and combinations thereof. The flexible membrane 200 can have a thickness of about 20-30 microns, about 30-50 microns, about 50-100 microns, about 100-200 microns, or about 200-300 microns. Within these ranges of thicknesses, a silicone membrane can have sufficient flexibility to stretch and deform when a key is pressed without overly increasing the stiffness of the movement of the key mechanism and undesirably causing multi-key presses when a single key is pressed.

Figure 4B:
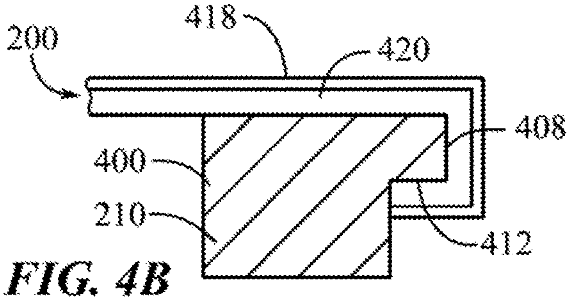

FIG. 4B shows an alternate embodiment of the membrane 200 having a multi-layer construction. Thus, the membrane 200 comprises an outer layer 418 and an inner layer 420. The outer layer 418 can comprise a durable elastomeric material such as, for example, a silicone or rubber material. The inner layer 420 can comprise a material with greater toughness than the outer layer 418 such as a mesh material (e.g., a woven or knitted fabric) or composite material bonded to the outer layer 418 and thereby providing reinforcement to the outer layer 418 against tearing, penetration, and plastic deformation by stretching. In some embodiments, the inner layer 420 can comprise VECTRAN™, aramid, KEVLAR®, TWARON®, carbon fiber, related materials, and combinations thereof. The outer layer 418 can be continuous and fluid-tight and can thereby prevent invasive material from being absorbed or caught into openings or gaps between fibers of the inner layer 420. Both layers 418, 420 can have their terminal edges affixed to and underneath the downward-facing surface 412 of the upper end 400 at inner sidewall 416.

Figure 4E:
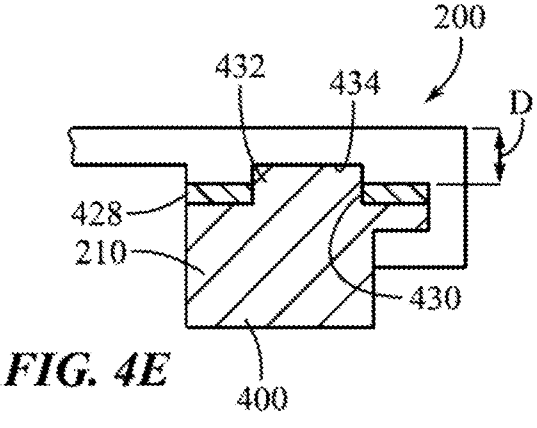
Figure 4C:
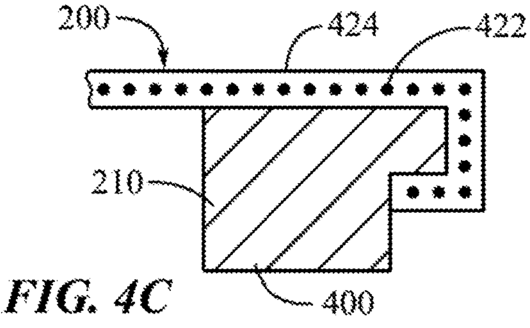

FIG. 4C shows an alternate embodiment of the membrane 200 having a composite construction. Thus, the membrane 200 comprises a reinforcement material 422 within a matrix material 424. The reinforcement material 422 is shown as a series of dots in the cross-section of FIG. 4C due to the reinforcement material 422 comprising a set of fibers or strands that are arranged in a mesh configuration. See, e.g., FIGS. 5 and 6. The matrix material 424 can comprise an elastomeric material described herein, and the reinforcement material 422 can comprise a material with relatively higher toughness and rigidity, such as VECTRAN™, aramid, KEVLAR®, TWARON®, carbon fiber, related materials, and combinations thereof. Accordingly, even if a pointed instrument applies a force sufficient to penetrate the matrix material 424, the reinforcement material 422 can be configured to withstand a greater force, thereby ensuring that the instrument does not make an even larger opening through the matrix material 424, as described in further detail in connection with FIGS. 5-6.

In some embodiments, the membrane 200 can have a multi-layer or composite construction, as shown in FIGS. 4B and 4C, across the entire top surface 114. Accordingly, the keyboard portion 109 and palm rest portion 108 of the membrane 200 can have the same material construction. In some embodiments, the portions 108, 109 can have different material construction. For example, the palm rest portion 108 can comprise a multi-layered membrane construction, and the keyboard portion 109 can have a composite membrane construction (or vice versa). In another example, one of the palm rest and keyboard portions 108, 109 can have a single-layer construction and the other portion can have a composite or multi-layered construction.

In embodiments including a track pad 106, the top surface of the palm rest portion 108 can comprise a feel and appearance similar to the top surface of the track pad 106. For example, the palm rest portion 108 and track pad 106 can both appear silver or black. In some embodiments, the membrane 200 can extend over the top of a rigid top surface of the track pad 106 such that the membrane 200 is consistent and unbroken (e.g., lacks opening 208) across the top surface of the track pad 106. The top surface of the track pad 106 can therefore be the membrane 200 and can accordingly have the same feel and color as the rest of the palm rest portion 108.

In some configurations, the palm rest portion 108 can have a glass or metal top surface that matches the appearance or feel of the top surface of the track pad 106. The glass or metal top surface can be completely planar across the track pad 106, and the perimeter of the track pad 106 can be indicated by a color of the glass or metal, by a light or other visible element through the glass or metal (e.g., through perforations in the metal), or by a similar indicator. In some embodiments, a rigid palm rest portion 108 can have a recess in the top surface that indicates the boundaries of the track pad 106, and the recess can lack openings, gaps, or cracks between the track pad 106 and the top surface of the palm rest portion 108. Instead, the recess can be a continuous, unbroken surface with the rest of the palm rest portion 108.

In some cases, the track pad 106 is positioned beneath a surface of the palm rest portion 108 that has a different texture from other adjacent areas of the palm rest portion 108. For example, the track pad 106 can be indicated in the palm rest portion 108 by a rougher or smoother texture than the surrounding area. In one case, a track pad 106 can have a matte texture while the rest of the palm rest portion 108 can have a relatively more glossy texture. The difference in texture can allow the user to determine the position of the track pad 106 by feel and by visual appearance.

Figure 5:
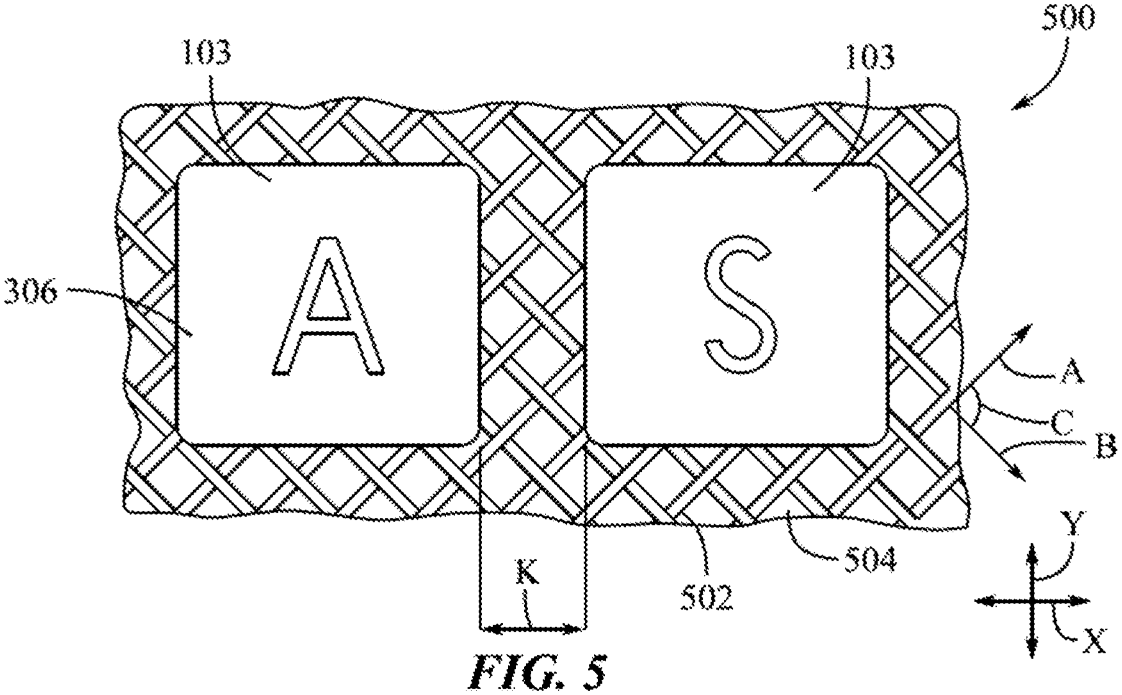
FIG. 5 is a top view of a membrane and keycaps of an electronic device.
Figure 6:
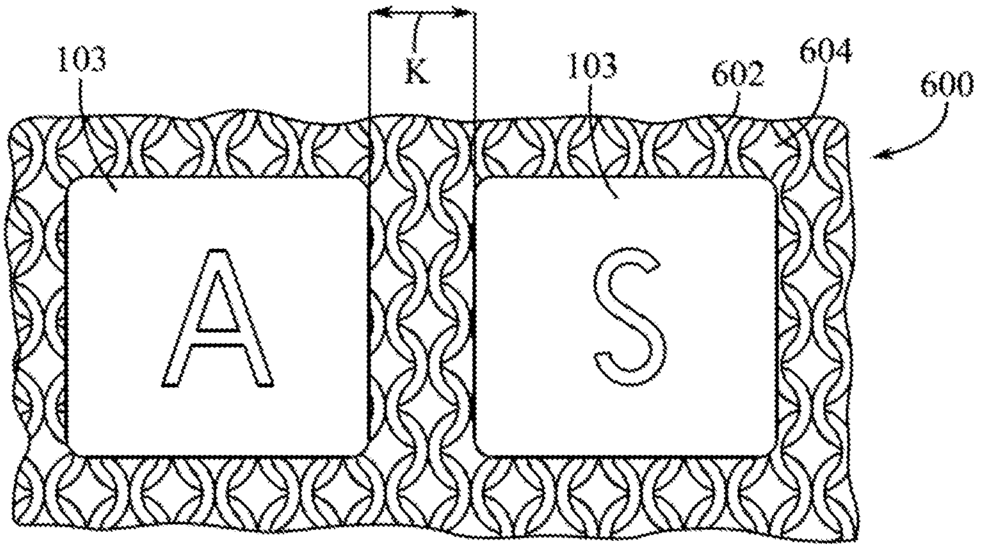
FIG. 6 is a top view of a membrane and keycaps of another embodiment of an electronic device.

FIGS. 5-6 show top views of a segment of composite membranes 500, 600 and keycaps 103 on the membranes 500, 600. The composite membranes 500, 600 can be embodiments of the membrane 200 of FIG. 4C. In FIGS. 5-6, mesh material 502, 602 is shown visible within the matrix material 504, 604. In some embodiments, the mesh material 502, 602 is suspended within the matrix material 504, 604 and is completely hidden and obscured by the top surface of the matrix material 504, 604, as indicated by FIG. 4C. The mesh material can comprise a series of strands or fibers arranged in a woven pattern (e.g., mesh material 502) or a knitted or chain-like pattern (e.g., mesh material 602). A woven pattern can comprise a series of weaves of overlapping and generally longitudinally straight intersecting strands. A knitted or chain-like pattern can be arranged similar to chainmail with a series of interlocking loops or rings of the strands.

The outer keycaps 103 can be spaced apart at an interkey distance K, as shown in FIGS. 5-6. The interkey distance K can span a width (e.g., along the X-axis) or a length (e.g., along the Y-axis) between two keycaps 103. The mesh material 502/602 can be configured to span across at least one interkey distance K and can extend underneath the keycaps 103 as well.

The membrane 500/600 can be most exposed and vulnerable to pointed instruments and debris within the interkey distance K. If a pointed instrument forms a tear or hole in the matrix material 504/604, the mesh material 502/602 can be configured to prevent the instrument from moving laterally (e.g., along the X or Y axis) and thereby enlarging the tear or hole. Additionally, after the pointed instrument is removed from the matrix material 504/604, the mesh material 502/602 can help prevent propagation of a tear or enlargement of a hole in the matrix material 504/604 due to its increased toughness, stiffness, and cut resistance as compared to the matrix material 504/604. The mesh material 502/602 can be resistant to enlargement of the spaces between the fibers or strands of the mesh due to the interwoven or interlinked/knitted engagement of the fibers or strands and due to the bond between the matrix material 504/604 and the fibers or strands.

Additionally, the chain-like or interwoven nature of the fibers or strands can be configured to not impart any force to the membrane matrix material 504/604 unless the matrix material fully elongates, and under normal conditions the matrix material 504/604 can be configured to elongate to less than its total possible elongation or to less than the amount of elongation that would result in a force imparted by the mesh material 502/602. Accordingly, the overall toughness of the composite membranes 500, 600 can be improved as compared to a membrane having only a material used as the matrix material.

As shown in FIG. 5, the mesh material 502 can be arranged in a woven pattern with a first array of parallel strands oriented parallel to a first direction (e.g., direction A) and a second array of parallel strands oriented parallel to a second direction (e.g., direction B) that is at an angle C relative to the first direction (e.g., direction A). The angle C between the first and second directions can be about 90 degrees, wherein the first array of strands and the second array of strands form a square or perpendicular pattern, as in the embodiment of FIG. 5. In some embodiments, the angle C can be less than or greater than about 90 degrees, wherein the first and second arrays of strands can form diamond shapes having a greater width along the Y-axis as compared to the width along the X-axis (or vice versa).

In some embodiments, the first array of strands can be parallel to the Y-axis and the second array of strands can be parallel to the X-axis. In other configurations, directions A and B can be oriented at an angle relative to the X and Y axes instead. For example, they can be oriented about 45-degrees offset from the X and Y axes, as shown in FIG. 5. By orienting the mesh material 502 at a non-orthogonal angle relative to the edges of the keycaps 103, the membrane 500 can have greater elongation during vertical movement of one keycap 103 relative to its neighbor. Accordingly, movement of the first keycap 103 can cause the membrane 500 to apply a smaller force to the second keycap 103. In this manner, the effect of the membrane 500 applying a force to neighboring keycaps 103 (due to their connection across the interkey distance K) can be reduced or eliminated.

In the membrane 600 of FIG. 6, the mesh material 602 can comprise a set of interlocking rings or knitted strands with interwoven loops or circuitous portions that form a stable and consistent pattern. The pattern of the mesh material 602 can be oriented relative to the edges of the keycaps 103 similar to the orientation of mesh material 502, wherein an axis of symmetry of the mesh material 602 can be oriented at a non-orthogonal or perpendicular angle relative to the edges of the keycaps 103. In some embodiments, the orientation of the mesh material 602 is selected to provide maximum flexibility and stretch within the interkey distance K in order to reduce or eliminate a pulling effect on the keycaps 103 when a nearby keycap 103 is pressed.

In some embodiments, the movement of the membrane 500/600 can cause neighboring key movement due to the membrane pulling on the neighboring key when a keycap 103 is pressed downward. This effect can be aesthetically unpleasing and distracting, and it can potentially cause multiple keys to press simultaneously when only one key press is intended. In order to minimize this effect, the keycaps 103 can comprise a top surface texture and shape that reduced or minimizes the visibility of this neighboring key movement effect. For example, outer keycaps 103 that are connected by a membrane can have a dished (e.g., spherically or cylindrically concave) top surface that is less likely to noticeably change the amount of light reflected back to the user when the keycap 103 tilts or otherwise shifts in response to a force applied by the interconnecting membrane. In another example, the outer keycaps 103 can be configured with a matte texture that minimizes the "flash" of a change in the angle of reflected light that faces the user as the keycap 103 moves.

In some embodiments, the outer keycaps 103 can be configured to have reduced shift or tilt when the membrane flexes due to being rigidly connected to the inner keycaps 206 (see, e.g., FIGS. 9-10 and their related descriptions herein) and due to the inner keycaps 206 being tightly connected to the stabilizer mechanisms 300 or other components below the inner keycaps 206. Having low tolerances for the fitment of those parts can therefore reduce the amount of available room for the outer and inner keycaps 103, 206 to shake, wobble, or jiggle when the membrane moves.

Figure 7:
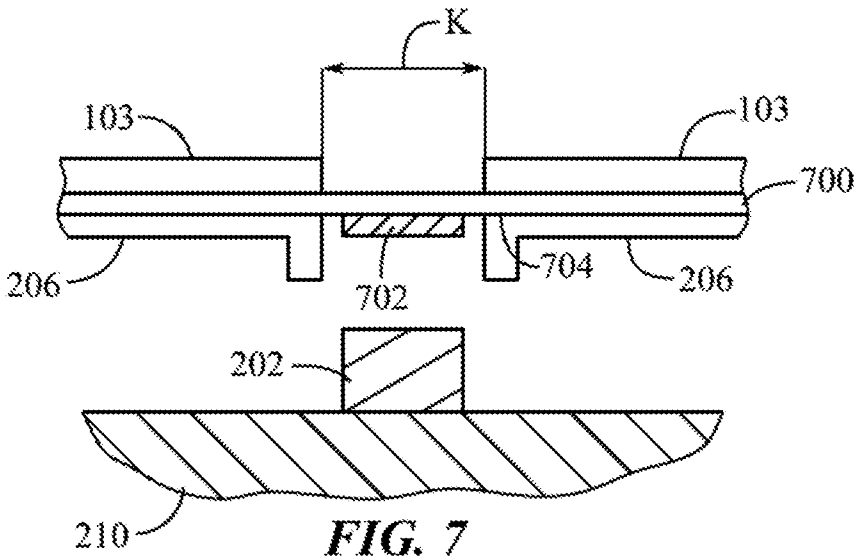
FIG. 7 is a side section view of an interkey space area of an embodiment of an electronic device.

FIG. 7 shows a side section view of a membrane 700 and two keycaps 103 above inner keycaps 206, a rigid web 202, and a base support 210. The keycaps 103 are separated by the interkey distance K, within which distance a reinforcement material 702 is positioned at a bottom surface 704 of the membrane 700. The reinforcement material 702 can have a width of about 75 percent of the total interkey distance K.

The reinforcement material 702 can comprise a substrate including a piece (e.g., a sheet) of metal, a composite material, a mesh material (e.g., similar to mesh materials 502/602), the same material used in the rest of the membrane 700 (e.g., silicone), related materials, and combinations thereof. Accordingly, the reinforcement material 702 can comprise a material that has increased stiffness and toughness relative to the material used in the membrane 700 or can at least increase the stiffness, thickness, and toughness of the membrane 700 where the reinforcement material 702 is applied.

In some embodiments, the membrane 700 comprises a composite construction with internal reinforcement wherein the membrane 700 has a mesh material (e.g., similar to mesh materials 502, 602) that only extends across the width of the interkey distance K equal to the width of the reinforcement material 702 shown in FIG. 7. Accordingly, there can be an internally-reinforced width of the interkey distance K and at least one non-internally-reinforced width in the interkey distance K. The reinforcement material 702 can therefore be within or interspersed inside the membrane 700 rather than being attached to the bottom surface 704.

The un-reinforced segments within the interkey distance K can be more flexible, bendable, and stretchable relative to the segment having the reinforcement material 702. In this manner, the membrane 700 can bend and stretch near the edges of the keycaps 103 in order to isolate movement of one keycap 103 relative to its neighbors. The membrane 700 can be reinforced across a portion (e.g., a majority) of the interkey distance K to protect the membrane 700 from punctures and tears without increasing the stiffness of the entire interkey distance K and thereby substantially synchronizing the movement of neighboring keycaps 103.

Figure 8:
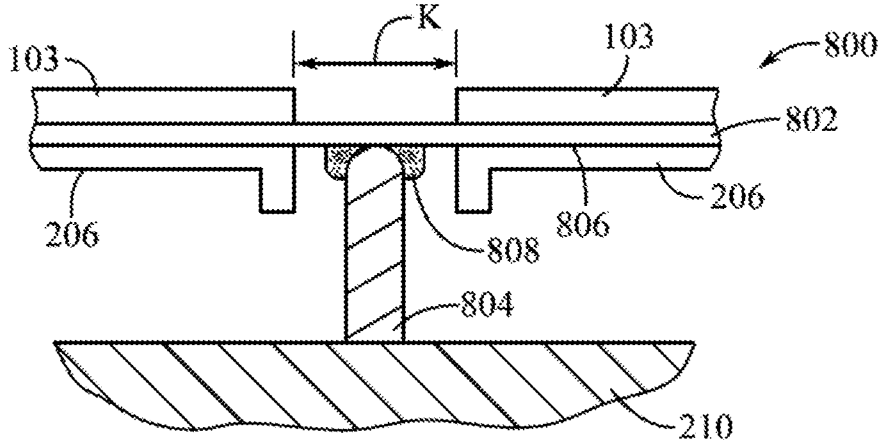
FIG. 8 is a side section view of another interkey space area of another embodiment of an electronic device.

FIG. 8 shows a related embodiment of a keyboard assembly 800 wherein the membrane 802 is reinforced by a web structure 804 that extends into close proximity or contact with the underside surface 806 of the membrane 802. A pointed instrument contacting the interkey distance K can therefore be prevented from penetrating and spreading apart the membrane 802 by being blocked or coming into contact with the web structure 804. Furthermore, a portion of the interkey distance K can be supported by the web structure 804 and can be thereby prevented from sagging or drooping below a generally planar, horizontal orientation between the keycaps 103.

A compressible structure 808 can be positioned between the top of the web structure 804 and the downward-facing surface of the membrane 802. The compressible structure 808 can be a spacer comprising a foam, rubber, or other compressible material. A vertical gap can be formed between at least a portion of the top of the web structure 804 and the underside of the membrane 802, and the gap can be filled by the compressible structure 808. Thus, the compressible structure 808 can provide support for a portion of the underside surface 806 of the membrane 802. The width of the compressible structure 808 can be greater than the width of the portion of the rigid web 804 within the interkey distance K. In some embodiments, the compressible structure 808 can be narrower than the entire interkey distance K and can therefore allow the un-contacted portions of the membrane 802 to move more freely relative to the web structure 804.

Referring again to FIGS. 2, 3, and 4D, in some cases the membrane 200 can be attached to a frame 426. The frame 426 can extend around the perimeter of the membrane 200 and can comprise a large central opening or space in which the inner keyboard module 204 can extend. The frame 426 can comprise a material that is relatively stiff in comparison to the material used in the membrane 200, such as a metal (e.g., steel) or rigid polymer (e.g., polycarbonate). Accordingly, the frame 426 can help preserve the generally planar shape and lateral width dimensions of the membrane 200 when the membrane 200 is separated from the upper end 400 and other components of the electronic device 100. The frame 426 can be positioned underneath the top portion 402 of the membrane 200 and above the top surface 404 of the upper end 400. The membrane 200 can be constructed with the frame 426 affixed to its underside surface, such as by co-molding or otherwise adhering the frame 426 to the membrane 200 while manufacturing the membrane 200.

In embodiments where the membrane 200 comprises a material with high flexibility (e.g., silicone), the frame 426 can be permanently attached to the membrane 200 more easily during the construction of the membrane 200 (e.g., while the membrane material is curing) than at a later point in the assembly process (e.g., after curing). Accordingly, the membrane 200 and frame 426 can be unified as a single piece when they are mounted to the upper end 400 of base support 210. Combining the membrane 200 and frame 426 can also make the combined component easier to move and position relative to individual component parts. Furthermore, the relatively rigid material of the frame 426 can be easier to attach to the top surface 404 of the upper end 400 due to being less flexible, and thereby being less likely to peel from, the top surface 404 after adhesives are applied between them.

FIG. 4E shows a related embodiment wherein a frame 428 is provided having similar materials and construction as frame 426, but wherein the frame 428 also comprises at least one aperture 430 through which a protrusion 432 of the upper end 400 can extend as the membrane 200 and frame 428 are assembled with the upper end 400. The membrane 200 can also comprise a recess 434 in which the protrusion 432 can extend. Thus, the protrusion 432 can be surrounded by the membrane 200 in at least two lateral directions and at least one vertical direction. The membrane 200 can also comprise an increased thickness dimension D, as shown in FIG. 4E. The recess 434 and aperture 430 can collectively provide a surface for a machine to grasp/interlock and align the membrane 200 and frame 428 during molding. The recess 434 and aperture 430 can also reduce the difficulty of assembling the membrane 200 and frame 428 to the upper end 400 by mechanically interlocking with the protrusion 432 and by increasing the contact surface area between the protrusion 432 and the membrane 200 and frame 428, thereby increasing friction and available area for application of adhesives to bond the membrane 200 and frame 428 to the protrusion 432.

Figure 9:
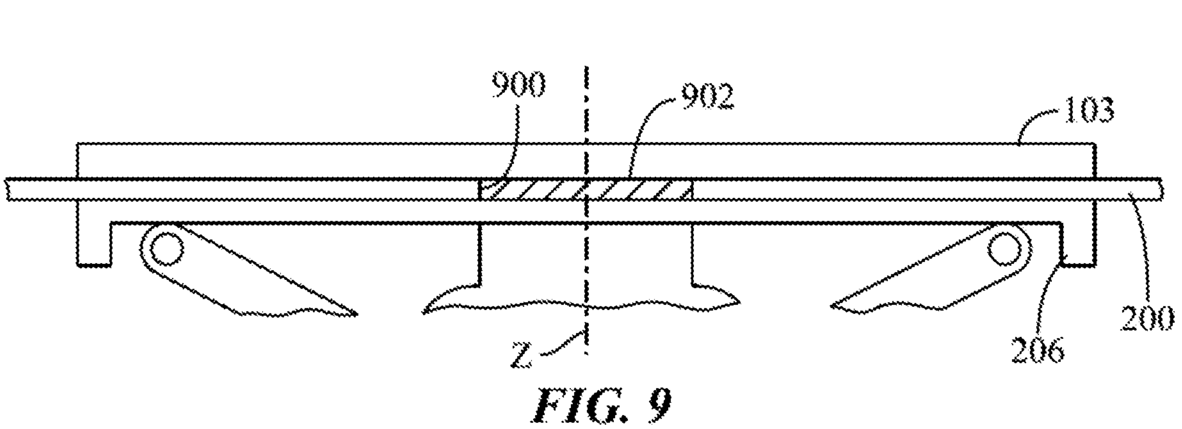
FIG. 9 is a side section view of an outer-to-inner keycap interface of an embodiment of an electronic device.

FIG. 9 is a side section view of an outer keycap 103, a membrane 200, and an inner keycap 206. In this embodiment, an aperture 900 is formed in the membrane 200 between the outer keycap 103 and the inner keycap 206. The aperture 900 can be filled with an adhesive material 902 or linking plug that bonds to the outer keycap 103 and inner keycap 206 in order to fuse them together and to align them along their vertical axis of motion Z. Accordingly, the adhesive material 902 can help ensure that the outer keycap 103 is not misaligned or peeled away from the inner keycap 206.

In some embodiments, the adhesive material 902 can be replaced or supplemented by at least one protrusion extending from the bottom the surface of the outer keycap 103 or from the top surface of the inner keycap 206. The protrusion can interlock with a protrusion or recess in the opposite keycap 103/206 to ensure a firm connection. Additionally, a protrusion can be adhered to be fastened to the opposite keycap 103/206.

Figure 10:
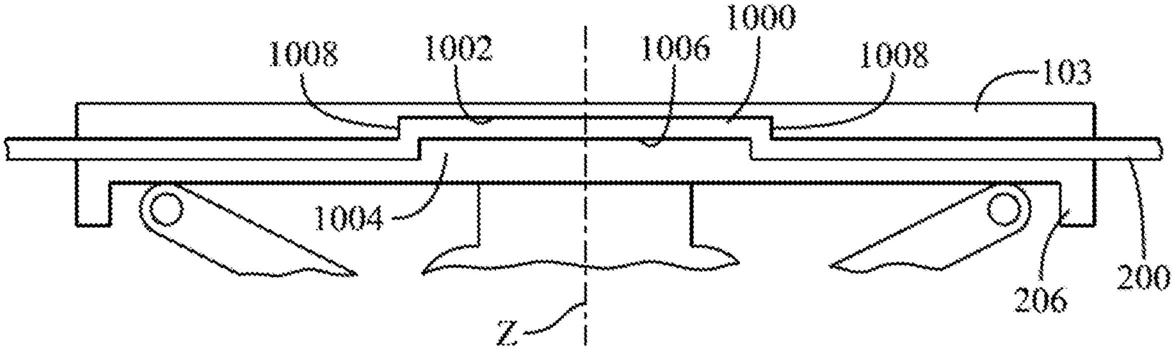
FIG. 10 is a side section view of another outer-to-inner keycap interface of an embodiment of an electronic device.

FIG. 10 is a side section view of an outer keycap 103 on a membrane 200 with an inner keycap 206. In this embodiment, a boss 1000 is formed in the membrane 200 between the outer keycap 103 and the inner keycap 206. The boss 1000 can be seated in a recess 1002 in the outer keycap 103. A protrusion 1004 of the inner keycap 206 can extend into a recess 1006 in the boss area of the membrane 200. The boss 1000, the recess 1002, and the protrusion 1004 can be centrally vertically aligned along the axis of motion Z. Accordingly, when the keycaps 103, 206 are attached to the membrane 200, the keycaps 103, 206 can be vertically aligned with each other due to being mechanically interlocked with the boss 1000. The boss 1000 can also have side surfaces 1008 that help prevent the outer keycap 103 or inner keycap 206 from sliding laterally on the membrane 200, such as in a direction perpendicular to the axis of motion Z, due to mechanical interference with the side surfaces 1008. The side surfaces 1008 also increase the contact surface area between the membrane 200 and the keycaps 103, 206, thereby also increasing the surface area for adhesion. In some embodiments, the boss 1000 can be inverted such that it extends vertically downward with the recess 1006 on its top surface. The protrusion 1004 can therefore extend from the outer keycap 103, and a recess 1002 can be formed in the inner keycap 206. Using the alignment features of FIGS. 9 and 10 can help ensure consistent alignment of keycaps 103/206, and, as a result, can also ensure consistent spacing between adjacent keycaps 103 and 206. Adhering the outer keycaps 103 to the membrane 200 can prevent them from tilting on top of the inner keycaps 206 (or other key mechanisms) in a manner that makes their lateral spacing appear undesirably inconsistent.

Figure 11:
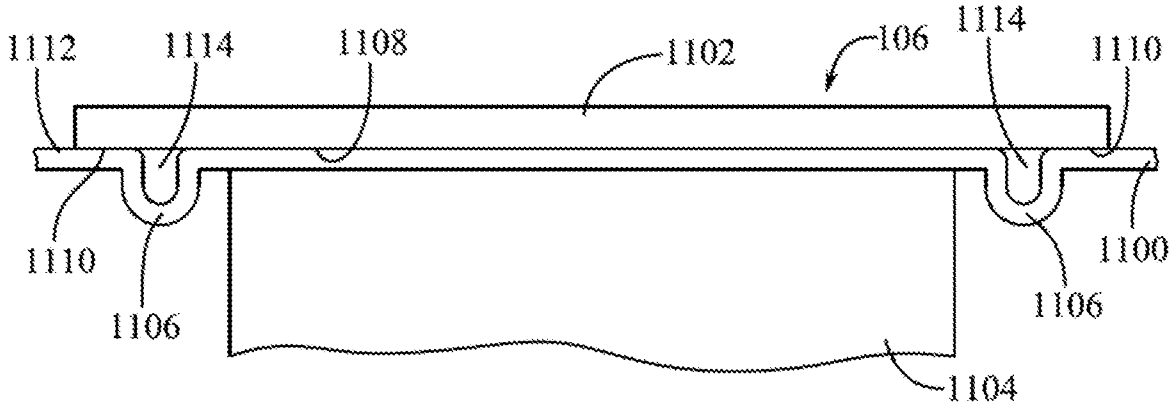
FIG. 11 is a side section view taken from a position similar to section lines 11-11 of FIG. 1 that shows a track pad interface of an embodiment of an electronic device.

Referring now to FIG. 11, a side section view of a track pad 106 and membrane 1100 is shown. The section view is similar to the section orientation indicated by section line 11-11 in FIG. 1. In this embodiment, however, the membrane 1100 lacks an opening (e.g., 208) for the track pad 106 and is instead unitary, consistent, and hole-free under the entire width of the track pad 106. Thus, the track pad 106 can comprise a rigid outer plate 1102 for engaging a user instrument (e.g., a finger, stylus tool, or similar device) and an inner component 1104 (e.g., capacitive sensor electronics) to sense the touch or motion of the user instrument on or nearby the rigid outer plate 1102. The outer plate 1102 and inner component 1104 can therefore work together to enable touch pad functionality through the membrane 1100 without being connected to each other by a conductor, wires, or similar connectors. The inner component 1104 can be protected from particle and fluid ingress through the membrane 1100.

The membrane 1100 can comprise a slack portion 1106 on at least one side of the outer plate 1102. As shown in FIG. 11, the slack portion 1106 can be positioned on both lateral sides of the outer plate 1102. In some embodiments, the slack portion 1106 can extend around an inner perimeter of the underside of the outer plate 1102. A central area 1108 of the outer plate 1102 can be adhered or otherwise attached to the membrane 1100, and a radially outer area 1110 of the outer plate 1102 can be unattached or movable/slidable on the top surface of the membrane 1100. Accordingly, application of downward pressure on the outer plate 1102 can move the central area 1108 relative to the radially outer portion 1112 of the membrane 1100, and the slack portions 1106 can bend or stretch to accommodate that relative motion without stretching or significantly deforming the radially outer portion 1112. The inner component 1104 can also be attached to the membrane 1100 across at least a portion of central area 1108.

In some embodiments, the outer plate 1102 can move horizontally or laterally when acted upon, such as by being moved by the inner component 1104. Accordingly, at least one slack portion 1106 can include an inner space 1114 into which the membrane 1100 can deform (or that can increase in size) as the outer plate 1102 moves horizontally. The slack portion 1106 can therefore have a general "U"-shaped cross-section, as shown in FIG. 11.

Figure 12:
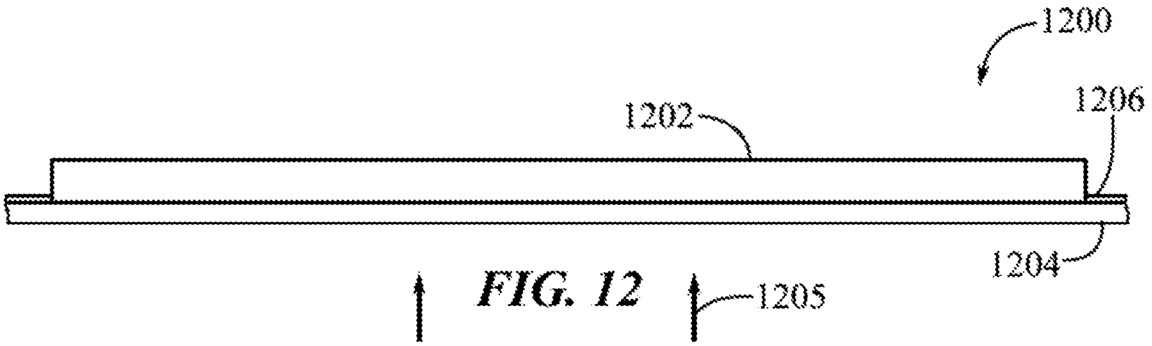
FIG. 12 is a side section view of another keycap interface of an embodiment of an electronic device.

FIG. 12 shows another side section view of a key assembly 1200 with an outer keycap 1202. In this case, the membrane 1204 can be formed with a transparent or translucent flexible material. The outer keycap 1202 can also comprise at least a portion having a transparent or translucent rigid material. Accordingly, light 1205 emitted from below the membrane 1204 can pass through the membrane 1204 and into or through the keycap 1202. An opaque material 1206 or and opaque layer can be positioned on the membrane 1204 and can prevent light from passing through the membrane 1204 around the outer keycap 1202. The opaque material 1206 can be positioned on the inner surface, outer surface, or both inner and outer surfaces of the membrane 1204. Additionally, the opaque material 1206 can be embedded in the membrane 1204 or applied to the surface of the membrane 1204 such as in a paint or coating for the membrane 1204. In some embodiments, the opaque material 1206 is part of an inner or outer layer of the membrane 1204, such as a metal, fabric, or mesh layer configured to occlude light through the membrane 1204.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

To the extent applicable to the present technology, gathering and use of data available from various sources can be used to improve the delivery to users of invitational content or any other content that may be of interest to them. The present disclosure contemplates that in some instances, this gathered data may include personal information data that uniquely identifies or can be used to contact or locate a specific person. Such personal information data can include demographic data, location-based data, telephone numbers, email addresses, TWITTER® ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to deliver targeted content that is of greater interest to the user. Accordingly, use of such personal information data enables users to calculated control of the delivered content. Further, other uses for personal information data that benefit the user are also contemplated by the present disclosure. For instance, health and fitness data may be used to provide insights into a user's general wellness, or may be used as positive feedback to individuals using technology to pursue wellness goals.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services or anytime thereafter. In another example, users can select not to provide mood-associated data for targeted content delivery services. In yet another example, users can select to limit the length of time mood-associated data is maintained or entirely prohibit the development of a baseline mood profile. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, content can be selected and delivered to users by inferring preferences based on non-personal information data or a bare minimum amount of personal information, such as the content being requested by the device associated with a user, other non-personal information available to the content delivery services, or publicly available information.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

What is claimed is:

1. A keyboard input device, comprising:

a base support having a top surface;

a flexible membrane extending across the top surface of the base support and comprising a perimeter and a membrane material;

an electronics unit including a set of multiple switch structures positioned between the base support and the flexible membrane; and a membrane frame extending around the perimeter of the flexible membrane and having a central opening surrounding the set of multiple switch structures, a top surface of the membrane frame contacting and being mounted to a bottom surface of the flexible membrane and comprising a frame material, the frame material being more rigid than the membrane material.

2. The keyboard input device of claim 1, wherein the membrane frame has a generally rectangular shape.

3. The keyboard input device of claim 1, wherein the membrane frame is mounted to the top surface of the base support.

4. The keyboard input device of claim 1, wherein the flexible membrane comprises a recess and the membrane frame comprises an aperture, the recess and the aperture being aligned with each other.

5. The keyboard input device of claim 4, wherein the base support includes a protrusion positioned in the recess and in the aperture.

6. The keyboard input device of claim 1, wherein a portion of the flexible membrane is positioned under the membrane frame.

7. The keyboard input device of claim 1, wherein the flexible membrane comprises an outer portion having an increased thickness dimension.

8. A keyboard, comprising:
a flexible membrane;
a pair of keycaps adhered or molded onto the flexible membrane and separated from each other by an interkey distance;
a material attached to a bottom surface of the flexible membrane within the interkey distance between the pair of keycaps;
a base support positioned below the flexible membrane; and
a pair of key mechanisms positioned between the base support and the pair of keycaps.

9. The keyboard of claim 8, wherein the material has a greater stiffness as compared to the flexible membrane.

10. The keyboard of claim 8, wherein the material is positioned entirely within the interkey distance.

11. The keyboard of claim 8, wherein a width of the material is less than the interkey distance.

12. The keyboard of claim 8, wherein the material includes a compressible foam.

13. The keyboard of claim 8, wherein the pair of keycaps comprises a pair of outer keycaps positioned on top of the flexible membrane and a pair of inner keycaps positioned under the flexible membrane.

14. The keyboard of claim 8, wherein a rigid web contacts the material.

15. A keyboard interface, comprising:
a membrane having a top surface, a bottom surface, and an aperture extending between the top surface and the bottom surface;
an outer keycap adhered or molded onto the top surface;
an inner keycap positioned on the bottom surface and aligned with the aperture and the outer keycap; and
a linking plug in direct contact with the outer keycap and the inner keycap through the aperture.

16. The keyboard interface of claim 15, wherein the outer keycap, the inner keycap, and the linking plug are centrally aligned along a vertical axis of motion.

17. The keyboard interface of claim 15, wherein the linking plug comprises an adhesive material bonded to the outer keycap and to the inner keycap.

18. The keyboard interface of claim 15, wherein the linking plug includes a protrusion extending from the inner keycap to interlock with a protrusion or recess in the outer keycap, or wherein the linking plug includes a protrusion extending from the outer keycap to interlock with a protrusion or recess in the inner keycap.

19. The keyboard interface of claim 15, wherein the linking plug includes a protrusion adhered to the outer keycap or the inner keycap.

* * * * *